United States Patent
Andersson et al.

(10) Patent No.: US 7,414,557 B2
(45) Date of Patent: Aug. 19, 2008

(54) METHOD AND APPARATUS FOR FEEDBACK SIGNAL GENERATION IN SIGMA-DELTA ANALOG-TO-DIGITAL CONVERTERS

(75) Inventors: Martin Andersson, Lund (SE); Lars Sundstrom, Lund (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 62 days.

(21) Appl. No.: 11/611,495

(22) Filed: Dec. 15, 2006

(65) Prior Publication Data

US 2008/0143570 A1    Jun. 19, 2008

(51) Int. Cl.
*H03M 3/00* (2006.01)

(52) U.S. Cl. .................. 341/143; 341/155; 341/118; 341/120

(58) Field of Classification Search .......... 341/143, 341/118, 120, 155, 172
See application file for complete search history.

(56) References Cited

U.S. PATENT DOCUMENTS

| | | | |
|---|---|---|---|
| 5,140,325 A | | 8/1992 | Yu et al. |
| 5,745,060 A | * | 4/1998 | McCartney et al. .......... 341/120 |
| 5,805,093 A | * | 9/1998 | Heikkila et al. .............. 341/143 |
| 5,907,299 A | * | 5/1999 | Green et al. ................. 341/143 |
| 5,982,315 A | | 11/1999 | Bazarjani et al. |
| 5,986,598 A | * | 11/1999 | Mittel ........................ 341/143 |
| 6,177,897 B1 | | 1/2001 | Williams, III |
| 6,184,812 B1 | | 2/2001 | Younis et al. |
| 6,445,321 B2 | | 9/2002 | Huang |
| 6,466,143 B2 | | 10/2002 | Eshaghi et al. |
| 6,693,572 B1 | * | 2/2004 | Oliaei et al. ................. 341/143 |
| 6,697,001 B1 | * | 2/2004 | Oliaei et al. ................. 341/143 |
| 6,734,816 B2 | | 5/2004 | Morimoto et al. |
| 7,042,377 B2 | | 5/2006 | Oliaei |

(Continued)

FOREIGN PATENT DOCUMENTS

EP        01538752        6/2005

(Continued)

OTHER PUBLICATIONS

Beilleau, N. et al. "Using Finite Impulse Response Feedback DACs to Design Sigma-Delta Modulators Based on LC Filters." 48th Midwest Symposium on Circuits and Systems, 2005. Aug. 7-10, 2005, pp. 696-699.

(Continued)

*Primary Examiner*—Linh V Nguyen
(74) *Attorney, Agent, or Firm*—Coats & Bennett, P.L.L.C.

(57) ABSTRACT

A method and apparatus taught herein provide a digital-to-analog converter (DAC) for use in a conversion feedback path of a sigma-delta type analog-to-digital converter (ADC). The DAC uses current pulse shaping to generate a conversion feedback signal in each feedback cycle of the ADC that provides a consistent charge transfer for accurate digital conversion and has a controlled current pulse shape. In one or more embodiments, the DAC includes a capacitor circuit for charge storage and transfer and a (series) resistive circuit having variable resistance for current pulse shape control. In at least one embodiment, current pulse control limits a peak current of the conversion feedback signal, thereby reducing DC power consumption and gain-bandwidth (GBW) and slew rate requirements of the ADC's integration amplifier, and limiting residual (ending) current in each feedback cycle, which yields commensurate gains in (feedback cycle) clock jitter insensitivity.

29 Claims, 10 Drawing Sheets

U.S. PATENT DOCUMENTS

| | | | |
|---|---|---|---|
| 7,230,555 B2 * | 6/2007 | Dolazza et al. | 341/143 |
| 7,242,336 B1 * | 7/2007 | Jensen | 341/143 |
| 2001/0009403 A1 | 7/2001 | Huang | |
| 2002/0105449 A1 * | 8/2002 | Schreier et al. | 341/139 |
| 2005/0206543 A1 | 9/2005 | Draxelmayr | |
| 2006/0055580 A1 | 3/2006 | Ortmanns et al. | |
| 2006/0109156 A1 * | 5/2006 | Colbeck et al. | 341/154 |
| 2006/0244643 A1 * | 11/2006 | Da Fonte Dias | 341/143 |
| 2007/0139241 A1 * | 6/2007 | Hales et al. | 341/143 |

FOREIGN PATENT DOCUMENTS

| | | |
|---|---|---|
| JP | 5037385 | 2/1993 |
| WO | 2002-071621 | 9/2002 |
| WO | 2003/052939 | 6/2003 |
| WO | 2006/067382 | 6/2006 |

OTHER PUBLICATIONS

Candy, J. et al. "A Per-Channel A/D Converter Having 15-Segment u-255 Companding." IEEE Transactions on Communications, vol. Com-24, No. 1, Jan. 1976, pp. 33-42.

Chen, Jess. "An Introduction to the PLL Library." http://www.cadence.com/whitepapers/pllapp_note.pdf.

Gothenberg, A. et al. "Low Oversampling Ratio Sigma-Delta Noise Shaper Architecture for Wideband Radio Applications."

Gothenberg, A. et al. "Nonlinear Quantization in Low Oversampling Ratio Sigma-Delta Noise Shapers for RF Applications." Analog Integrated Circuits and Signal Processing, vol. 30 , pp. 193-206, 2002.

Gray, R. "Quantization Noise in Delta-Sigma A/D Converters." Chapter 2 in Delta-Sigma Data Converters. Wiley, John & Sons, Inc. Oct. 1996, ISBN: 0780310454.

Latiri, A. et al. "Design of Continuous-Time Sigma-Delta Modulators with Sine-Shaped Feedback DACs." IEEE International Symposium on Circuits and Systems, 2005. May 23-26, 2005, vol. 4, pp. 3672-3675.

Li, B. et al. "A Second Order Sigma Delta Modulator Using Semi-Uniform Quantizer with 81 dB Dynamic Range at 32x OSR." Proceedings of the 28th European Solid-State Circuits Conference, 2002. Sep. 24-26, 2002, pp. 579-582.

Li, B. et al. "Sigma Delta Modulators Using Semi-Uniform Quantizers." The 2001 International Symposium on Circuits and Systems. May 6-9, 2001, pp. 456-459.

Luckjiff, Glen et al. "Hexagonal Sigma Delta Modulators in Power Electronics." IEEE Transactions on Power Electronics, Sep. 2005, vol. 20, No. 5, pp. 1075-1083.

Luschas, S. et al. "High-Speed Sigma Delta Modulators with Reduced Timing Jitter Sensitivity." IEEE Transactions on Circuits and Systems—II: Analog and Digital Signal Processing, vol. 49, No. 11, Nov. 2002, pp. 712-720.

Oliaei, O. "Sigma-Delta Modulator with Spectrally Shaped Feedback." IEEE Transactions on Circuits and Systems—II: Analog and Digital Signal Processing, vol. 50, No. 9, Sep. 2003, pp. 518-530.

Ortmanns, M. et al. "Compensation of Finite Gain-Bandwidth Induced Errors in Continuous-Time Sigma-Delta Modulators." IEEE Transactions on Circuits and Systems—I: Regular Papers, vol. 51, No. 6, Jun. 2004, pp. 1088-1099.

Ortmanns, M. et al. "Clock Jitter Insensitive Continuous-Time Sigma Delta Modulators." The 8th IEEE International Conference on Electronics, Circuits and Systems, 2001. Sep. 2-5, 2001, vol. 2, pp. 1049-1052.

Ortmanns, M. et al. "Implementation of a 1.5V Low-Power Clock-Jitter Insensitive Continuous-Time Sigma Delta Modulator." IEEE International Symposium on Circuits and Systems, 2002. May 26-29, 2002, vol. 2, pp. II-652-II-655.

Ortmanns, M. et al. "A Continuous-Time Sigma Delta Modulator with Reduced Sensitivity to Clock Jitter Through SCR Feedback." IEEE Transactions on Circuity and Systems—I: Regular Papers, vol. 52, No. 5, May 2005, pp. 875-884.

Ortmanns, M. et al. "Fundamental Limits of Jitter Insensitivity in Discrete and Continuous-Time Sigma Delta Modulators." Proceedings of the 2003 International Symposium on Circuits and Systems. May 25-28, 2003, vol. 1, pp. I-1037-I-1040.

Pavan, S. et al. "Widely Programmable High-Frequency Continuous-Time Filters in Digital CMOS Technology." IEEE Journal of Solid-State Circuits, vol. 35, No. 4, Apr. 2000, pp. 503-511.

Putter, B. "Sigma Delta with Finite Impulse Response Feedback DAC." 2004 IEEE International Solid-State Circuits Conference. Feb. 15-19, 2004, vol. 1, pp. 76-77.

Shamsi, H. et al. "A New Method for Elimination of the Clock Jitter Effects in Continuous Time Delta-Sigma Modulators." IEICE Trans. Fundamentals, vol. E88-A, No. 10, Oct. 2005, pp. 2570-2578.

Shamsi, H. et al. "Analysis of the Clock Jitter Effects in a Time Invariant Model of Continuous Time Delta Sigma Modulators." IEICE Trans. Fundamentals, vol. E89-A, No. 2, Feb. 2006, pp. 399-407.

Shamsi, H. et al. "A Simplified Illustration of Arbitrary DAC Waveform Effects in Continuous Time Delta-Sigma Modulators." IEICE Trans. Fundamentals, vol. E-88-A, No. 12, Dec. 2005, pp. 3577-3579.

Van Veldhoven, R. "A Triple-Mode Continuous-Time Sigma Delta Modulator with Switched-Capacitor Feedback DAC for a GSM-EDGE/CDMA2000/UMTS Receiver." IEEE Journal of Solid-State Circuits, vol. 38, No. 12, Dec. 2003, pp. 2069-2076.

Wiemer, I. et al. "Linear and Nonlinear Decoding for the First-Order Sigma-Delta Modulator." http://www.iee.et.tu-dresden.de/iee/ge/sfb/E1/pub/2003/wiemer4.pdf.

Zhang, Z. et al. "Multibit Oversampled Sigma-Delta A/D Convertor with Nonuniform Quantisation." Electronics Letters, Mar. 14, 1991, vol. 27, No. 6, pp. 528-529.

* cited by examiner

METHOD AND APPARATUS FOR FEEDBACK SIGNAL GENERATION IN SIGMA-DELTA ANALOG-TO-DIGITAL CONVERTERS

TECHNICAL FIELD

The present invention generally relates to sigma-delta analog-to-digital conversion methods and apparatus, and particularly relates to improved feedback signal generation therein.

BACKGROUND

Sigma-delta analog-to-digital converters (ADCs) represent a popular choice for a wide range of analog-to-digital conversion applications, including precision industrial and scientific applications, and in digital signal processing applications, such as within digital communication transceivers. Their advantages include increasing viability with continuing advances in integrated circuit technology, and the ability to shift quantization noise well outside the frequency range of interest.

FIG. 1 illustrates a simple example of a first-order sigma-delta analog-to-digital converter (ADC) 10 according to a known arrangement, which includes a loop filter 12, a quantizer 14, a decimation filter 16, and a digital-to-analog converter (DAC) 18. According to well known operation, the loop filter 12 receives an analog input signal u, combines it with an analog conversion feedback signal $v_a$, and generates a corresponding loop filter output signal y. In turn, quantizer 14—here, shown as a single-bit quantizer-outputs a digital value, e.g., 1 or 0, indicating whether the loop filter output signal y is above or below a reference value. For example, the reference value for the quantizer 14 is 0, so it outputs a digital 1 if its input is positive and a digital 0 if its input is negative. The digital stream, $v_d$, output by the quantizer 14 drives the DAC 18, which converts the digital feedback into the aforementioned (analog) conversion feedback signal $v_a$.

FIG. 2 offers additional details for the ADC 10, wherein the loop filter 12 includes a single integrating amplifier 20 having an input signal resistance 22 and a feedback capacitor 24. The quantizer 14 includes an n-bit quantization circuit 26 that compares its input signal to a reference signal at time instants driven by an applied clock signal. Of more interest, the DAC 18 is configured as a switched current source and includes a resistor 30 in the conversion feedback path, which is switchably coupled through switch 32 to one of a signal reference (e.g., ground) and $\pm V_{REF}$. The 1s and 0s in the digital stream generated by the quantizer 14 drive the switch 32 determine whether $+V_{REF}$ or $-V_{REF}$ is coupled to the loop filter 12 through the resistor 30 in each feedback cycle of the ADC 10.

Therefore, in each feedback cycle, the DAC 18 generates a positive (or negative) current pulse (denoted as an "SI" pulse to indicate the switched current source basis for pulse generation) reflecting the value of the digital bit output by the quantizer 14 for that cycle. It is important that the DAC 18 generates the current pulse consistently in each cycle, such that the same amount of charge is transferred between the DAC 18 and the loop filter 12 in each feedback cycle. The current-source configuration of DAC 18 works well in that regard, with FIG. 3 illustrating an example positive-going current pulse for the conversion feedback signal. However, one sees from the waveform illustration depicted in FIG. 3 that the conversion feedback signal current pulse maintains its full magnitude across the full pulse width, such that at the end of the feedback cycle, time $T_P$, the signal current is still at full magnitude.

With this high-current pulse ending condition, the total amount of charge, $Q_{tot}$, transferred by the DAC 18 in each feedback cycle is dramatically dependent on the pulse width. Any jitter in the feedback cycle clock signal, i.e., jitter in the clock signal that establishes the conversion feedback signal pulse width, can substantially increase or decrease the amount of charge transferred in a given feedback cycle, leading to inaccuracy in the ADC 10.

FIG. 4 illustrates another known arrangement for the sigma-delta ADC 10, which addresses clock jitter sensitivity concerns. Here, the DAC 18 uses a capacitor 34 for charge transfer in each feedback cycle, where the capacitor is charged to $\pm V_{REF}$. In contrast to the DAC configuration of FIG. 1, the configuration here provides for a decreasing conversion feedback signal current, as illustrated in FIG. 5, that decays to some lower threshold, Ir, by time $T_P$. Because the current magnitude of the conversion feedback signal is relatively low at the end of the feedback cycle, the total amount of charge transferred during the feedback cycle does not change much with clock jitter. Unfortunately, relatively high peak currents must be tolerated in this configuration, and the presence of these high peak currents increases DC power consumption, and imposes high gain-bandwidth (GBW) and slew rate requirements on the integrating amplifier 20 in the loop filter 12.

The above examples thus illustrate the use of a current-source based DAC that reduces or eliminates high peak currents but exhibits high sensitivity to clock jitter, and a capacitor-based DAC that exhibits good clock jitter sensitivity but imposes high GBW and slew rate requirements on integrating amplifiers because of its high peak currents, and results in higher DC current consumption. As such, both approaches compromise the design and performance of sigma-delta ADCs.

SUMMARY

Sigma-delta analog-to-digital converters (ADCs) offer a number of operational advantages, including quantization noise shaping, but they are sensitive to the characteristics and performance of the digital-to-analog converters (DACs) commonly used in their conversion feedback paths. To that end, a method and apparatus taught herein provide an improved DAC for use in the conversion feedback path of a sigma-delta ADC. The DAC uses current pulse shaping to generate a conversion feedback signal in each feedback cycle of the ADC that provides a consistent charge transfer for accurate digital conversion and has a controlled current pulse shape. In at least one embodiment, current pulse control limits a peak current of the conversion feedback signal, thereby yielding commensurate reductions in DC current consumption and the gain-bandwidth (GBW) and slew-rate requirements of the ADC's integration amplifier. Further current pulse control limits residual (ending) current in each feedback cycle, thereby yielding commensurate gains in (feedback cycle) clock jitter insensitivity for continuous-time (CT) sigma-delta ADCs.

In one embodiment, a DAC for generating a conversion feedback signal in a sigma-delta type ADC functions as a current pulse generator and comprises a capacitor circuit configured to be pre-charged to a reference voltage for each feedback cycle of the ADC, and a resistive circuit for transferring charge between the capacitor circuit and a loop filter of the ADC in each feedback cycle. The resistive circuit is configured to vary its resistance during each feedback cycle in accordance with a desired current pulse shape for the conversion feedback signal. In at least one such embodiment, the desired current pulse shape is defined by a desired amount of charge to be transferred in each feedback cycle and desired maximum and residual current values for the conversion feedback signal in each feedback cycle.

In one or more embodiments, the resistive circuit, which provides series resistance for charge transfer between the capacitor circuit and the (ADC) loop filter, comprises a continuously variable resistance device and an associated resistance control circuit. Current pulse shaping of the conversion feedback signal is realized in each feedback cycle by the resistance control circuit varying the resistance of the variable resistance device during each feedback cycle. By way of non-limiting example, the continuously variable resistance device comprises a pass transistor device, and the resistance control circuit adjusts one or more bias signals of the pass transistor device during each feedback cycle according to the desired current pulse shape of the conversion feedback signal. Of course, such bias signal control may exhibit discrete time changes or continuous time changes.

In one or more other embodiments, the resistive circuit comprises a parallel resistor network whose number of resistors actively connected in parallel is changed over the feedback cycle. More particularly, in at least one embodiment, the resistive circuit comprises a parallel resistor network coupled to the capacitor circuit through a switching control circuit that, during each feedback cycle, is configured to increase over time the number of parallel resistors coupling the capacitor circuit to an output node of the resistive circuit. Of course, other switched resistor network arrangements may be used—e.g., series-switched resistors, where switching control over the feedback cycle progressively reduces the series resistance.

In at least one switching embodiment, the switching control circuit comprises a switching delay circuit that generates successively delayed switch activation signals during each feedback cycle, wherein each switch activation signal increases (decreases) the number of parallel (series) resistors coupling the capacitor circuit to the output node of the resistive circuit. Switching delays are uniform in one or more embodiments, and non-uniform in one or more other embodiments. Non-uniform delay spacing is used in at least one embodiment to further reduce current peaks in the conversion feedback signal.

In another embodiment, a method of generating a conversion feedback signal in a sigma-delta type ADC comprises generating the conversion feedback signal in each feedback cycle of the ADC as a current pulse from a capacitor circuit, and varying a series resistance associated with the capacitor circuit during each feedback cycle according to a desired current pulse shape for the conversion feedback signal. The method includes defining the desired current pulse shape based on a desired amount of charge to be transferred in each feedback cycle and desired maximum and residual current values for the conversion feedback signal in each feedback cycle. For example, the method may include determining the desired maximum current value in accordance with DC current consumption goals and/or gain-bandwidth and slew-rate requirements of the integrating amplifier within the ADC's loop filter, and determining the desired residual current value in accordance with a desired level of clock jitter insensitivity.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
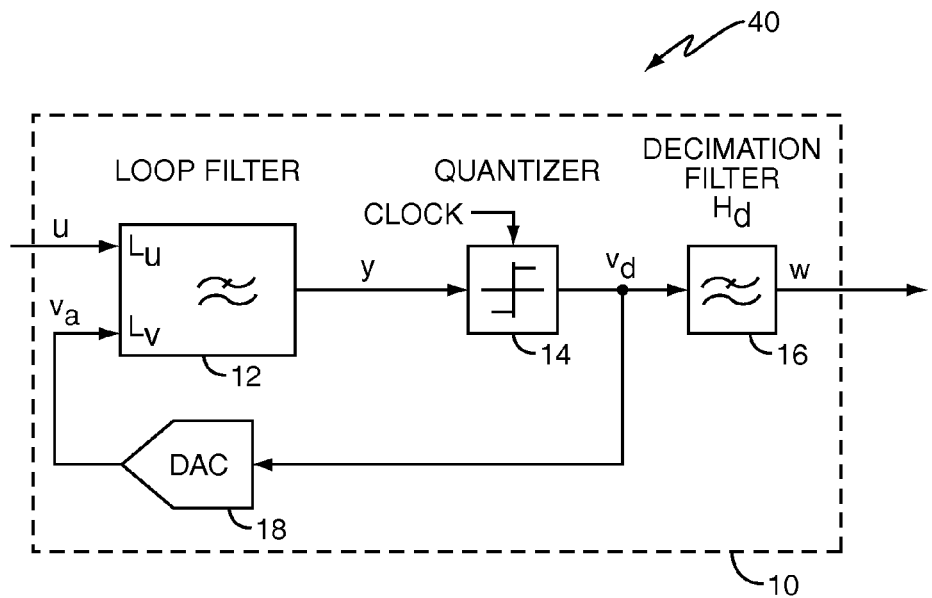
FIG. 1 is a block diagram of a known sigma-delta ADC.
Figure 2:
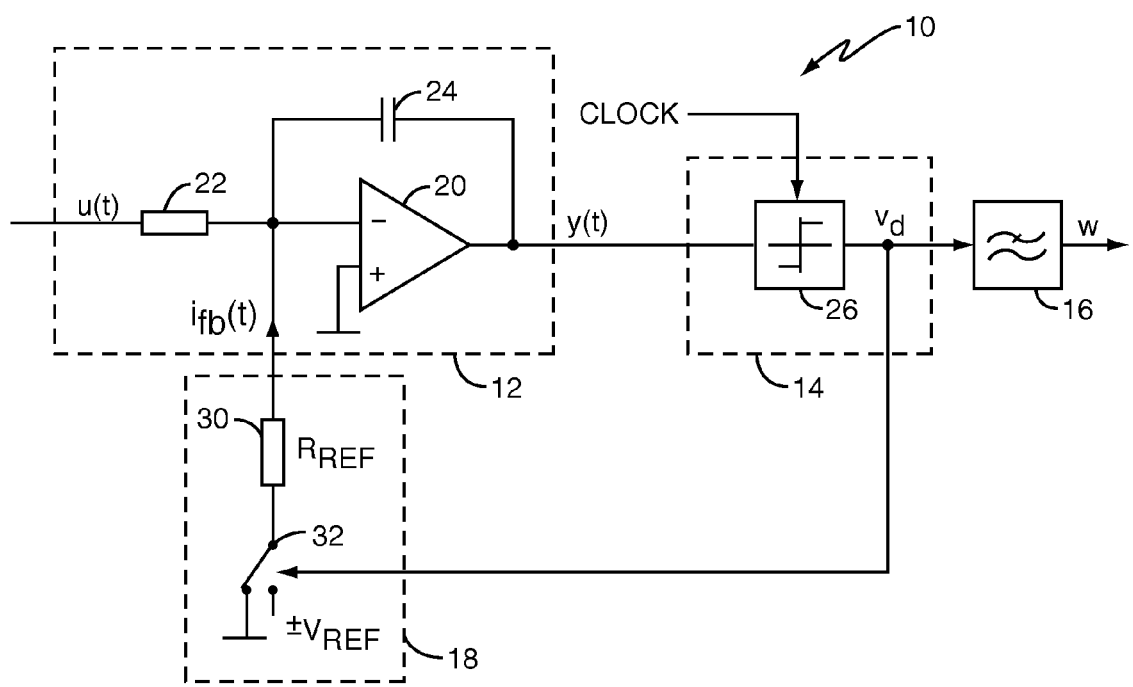
FIG. 2 is a block diagram of one implementation for the DAC in the ADC of FIG. 1.
Figure 3:
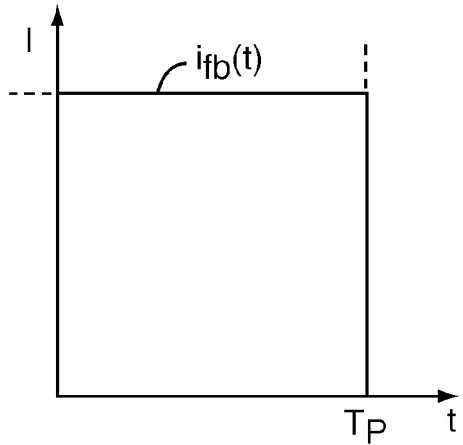
FIG. 3 is a graph of a DAC output signal for the ADC of FIG. 2.
Figure 5:
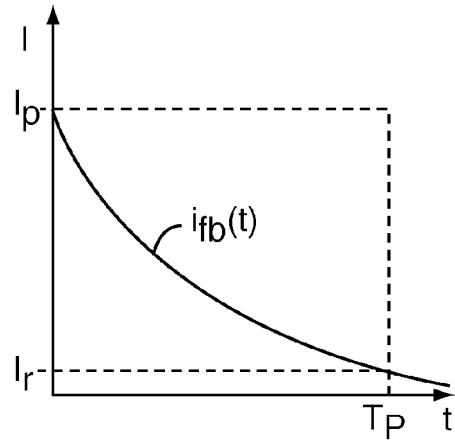
FIG. 5 is a graph of a DAC output signal for the ADC of FIG. 4.
Figure 4:
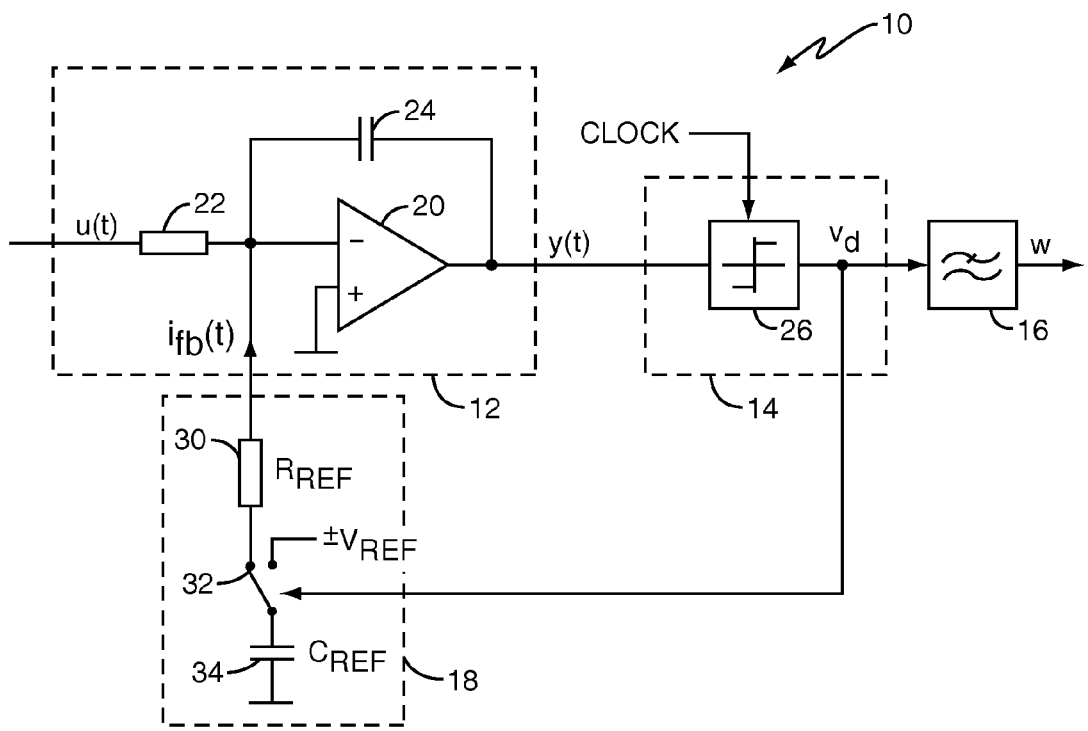
FIG. 4 is a block diagram of another implementation for the DAC in the ADC of FIG. 1.
Figure 6:
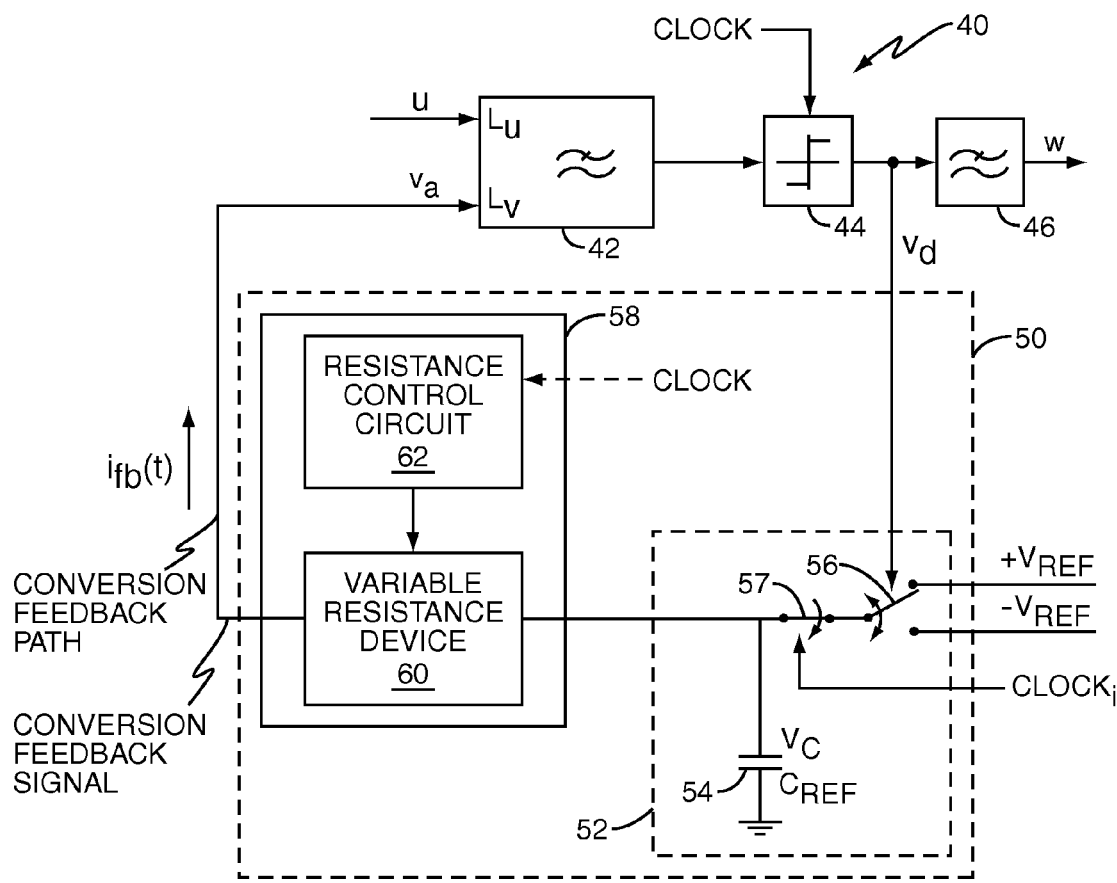
FIG. 6 is a block diagram of one embodiment of a sigma-delta ADC, including a DAC having good clock jitter insensitivity and well-controlled maximum current for the conversion feedback signal generated by it.

FIG. 6 illustrates one embodiment of a sigma-delta ADC 40, such as may be used in signal processing operations within a wireless communication receiver (not illustrated). The illustrated embodiment comprises a continuous-time sigma-delta ADC 40, which includes a loop filter 42, a quantizer 44, and a decimation filter 46, which itself may comprise all or part of a digital signal processor configured to implement low-pass or other digital-domain filtering. Those skilled in the art will appreciate that, while a first-order ADC is illustrated, the teachings herein apply directly to delta-sigma ADCs with higher-order loop filters.

Of particular interest to the discussion herein, the ADC 40 includes a DAC 50 for generating a conversion feedback signal for the loop filter 42, wherein the DAC 50 functions as a current pulse generator and comprises a capacitor circuit 52, including one or more capacitors 54 and an associated pre-charging switches 56 and 57 defining the sign and timing of the capacitor pre-charging, and a resistive circuit 58, including a variable resistance device 60 and an associated resistance control circuit 62. The resistive circuit 58 couples the capacitor circuit 52 to a conversion feedback signal input of the loop filter 42, and thus provides a series resistance connection for transferring charge between the capacitor circuit 52 and the loop filter 42 of the ADC 40 in each feedback cycle of the ADC 40.

Figure 7:
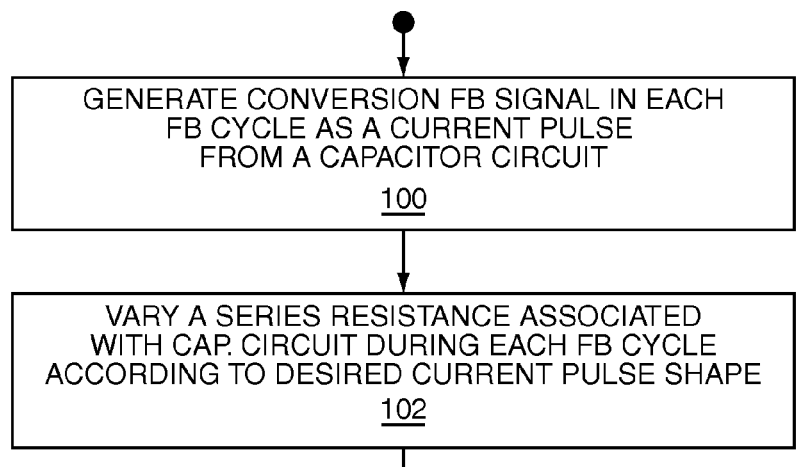
FIG. 7 is a logic flow diagram for one embodiment of processing logic for DAC-based generation of a conversion feedback signal having good clock jitter insensitivity and well-controlled maximum current.

More particularly, FIG. 7 illustrates one embodiment of DAC operation. The illustrated method comprises generating the conversion feedback signal in the DAC 50 in each feedback cycle of the ADC 40 as a current pulse from the capacitor circuit 52 (Step 100), and varying the effective series resistance (of the resistive circuit 58) during each feedback cycle according to a desired current pulse shape for the conversion feedback signal (Step 102). Of course, those skilled in the art will recognize that these sequentially illustrated steps may be performed concurrently, i.e., the series resistance changes over each feedback cycle to control conversion feedback signal current and thereby effects the desired current pulse shape for the conversion feedback signal.

Figure 8:
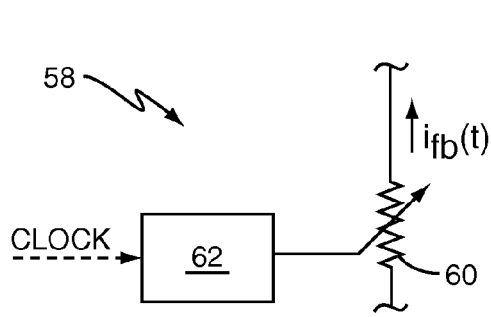
FIG. 8 is a block diagram of one embodiment of the DAC resistive circuit illustrated in FIG. 6.
Figure 9:
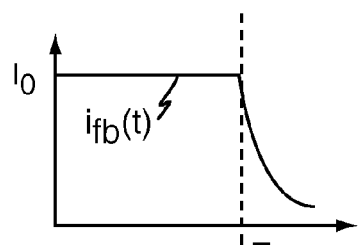
FIGS. 9-11 are graphs of signal current, capacitor voltage, and corresponding series resistance for a conversion feedback signal generated by one embodiment of the DAC illustrated in FIG. 6 or 8.

FIG. 8 broadly illustrates such operation of the resistive circuit 58, wherein the resistance control circuit 62 varies the resistance of the variable resistance device 60 during each feedback cycle of the ADC 40, in accordance with the current pulse shape desired for the conversion feedback signal. For example, FIG. 9 illustrates a more or less square, constant-current pulse for the conversion feedback signal current, $i_{fb}(t)$, which may be obtained by the resistance control circuit 62 linearly decreasing the series resistance of the variable resistance device 60 as the capacitor 54 discharges (or charges) from its pre-charged voltage ($+$ or $-V_{REF}$ through the variable resistance device 60. (Note that $C_{REF}$ is pre-charged to a defined reference voltage level for each feedback cycle of the ADC 40. A clock signal fed to the DAC 50 defines the feedback cycle time, and the value of $v_d$ in each feedback cycle may be used to pre-charge the capacitor 54 to either $+V_{REF}$ or $-V_{REF}$. Note that the same or another clock signal may be provided to the quantizer 44 to drive timed sampling.)

Figure 10:
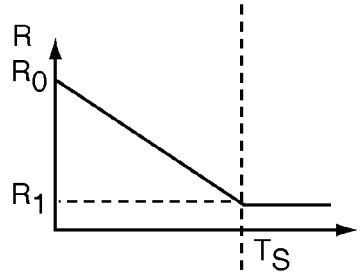

Notably, as shown in FIG. 10, the resistance control circuit 62 is configured to linearly decrease the series resistance of the variable resistance device 60 from an initial resistance $R_0$ at the beginning of a feedback cycle, to a final or ending resistance $R_1$ at the ending of the feedback cycle, as marked by time $T_S$. Thus, the resistive circuit 58 is configured to exhibit a maximum resistance at a beginning of a feedback cycle and to reduce its resistance during the feedback cycle, and thereby exhibit a minimum resistance at an end of the feedback cycle.

Figure 11:
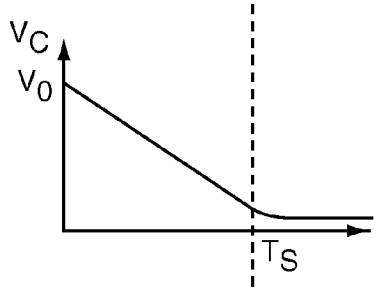

Such operation in combination with the decaying capacitor voltage $V_c$ shown in FIG. 11 maintains a relatively constant current magnitude for the conversion feedback signal pulse during the feedback cycle, while allowing a rapid current fall-off at the end of the cycle. As such, the resistive circuit 58 provides for a desired amount of charge transfer between the capacitor circuit 52 and the loop filter 42, while simultaneously exhibiting good clock jitter insensitivity and reduced or eliminated current peaking.

Thus, the above method may be understood to include, or otherwise depend on, defining the desired current pulse shape based on a desired amount of charge to be transferred in each feedback cycle (of the subject ADC) and desired maximum and residual current values for the conversion feedback signal in each feedback cycle. For example, one may determine the desired maximum current value of the conversion feedback signal in accordance with a gain-bandwidth limit of the loop filter 42—i.e., the maximum current may be constrained according to DC current consumption requirements and/or the GBW/slew-rate limitations of the integration amplifier(s) selected for use within the loop filter 42. Further, one may determine the desired residual current value of the conversion feedback signal in accordance with a desired level of clock jitter insensitivity. The reduced GBW/slew requirements may allow for lower operating powers and reduced circuit cost, and the decreased clock jitter sensitivity may allow for lower circuit costs and/or relaxed design and layout requirements.

Referring again to FIG. 8, in one embodiment, the variable resistance device 60 comprises a pass transistor device, and resistance control circuit 62 is configured to change or otherwise adjust one or more bias signals of the pass transistor device over the feedback cycle. Use of a pass transistor device for the variable resistance device 60 allows for continuous resistance adjustment, if desired. Of course, in at least one such embodiment, the bias signal may be step-wise adjusted over the feedback signal to effect discrete time changes in the series resistance of the pass transistor device, rather than continuously adjusted.

Figure 12:
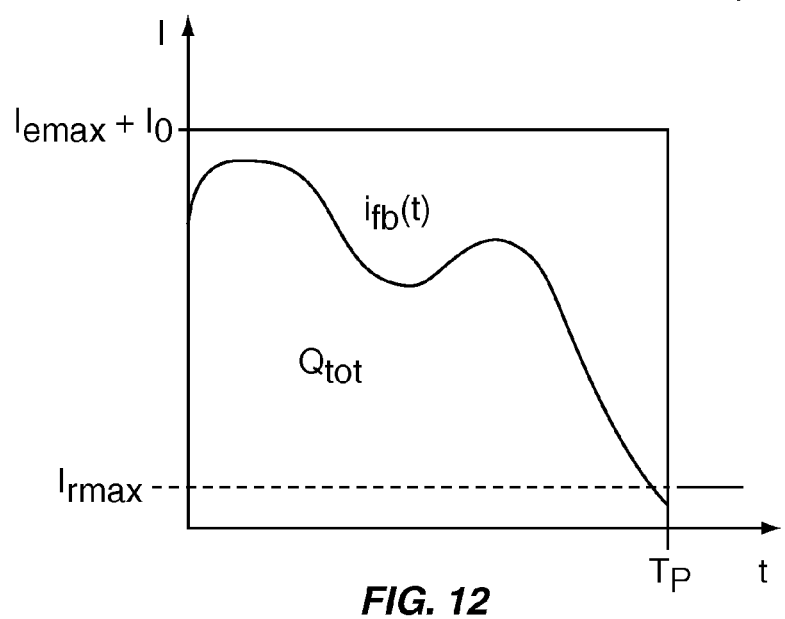
FIG. 12 is a graph of one embodiment of bounding constraints associated with defining a desired current pulse shape for the conversion feedback signal from the DAC of FIG. 6.

FIG. 12 illustrates one embodiment of current pulse bounding that may be implemented by the DAC 50, regardless of the particular resistance control that is implemented. Over the time period $T_P$, a square current pulse of magnitude $I_0$ integrates to a total charge of:

$$Q_{tot} = T_P \cdot I_0 \qquad \text{Eq. (1)}$$

One design boundary for the current pulse shape of the conversion feedback signal $i_{fb}(t)$ is that the integrated current should be equal to the total charge $Q_{tot}$ delivered by a "model" square current pulse having the nominal pulse width timing, i.e., $$Q_{tot} = \int_0^{T_P} i_{fb}(t)\,dt \qquad \text{Eq. (2)}$$

The residual current level $I_r$ of the current pulse shape at time $T_P$ determines the clock jitter sensitivity of the DAC 50. More particularly, lower values of $I_r$ yield reduced jitter sensitivity. Thus, one may set the residual current value $I_r$ according to a maximum residual current threshold of $I_{rmax}$, corresponding to a desired degree of clock jitter insensitivity. Further, as a consequence of the total charge boundary constraints introduced above, the peak current $I_p$ of $i_{fb}(t)$ will necessarily be higher than the nominal constant-current magnitude $I_0$ of the nominal square current pulse that would transfer the desired amount of charge, $Q_{tot}$. For convenience, one may refer to the difference between the peak current, $I_p$, required for the shaped current pulse generated by DAC 50 and the nominal current $I_0$ as the "excess" current given by, $$I_e = I_p - I_0 \qquad \text{Eq. (3)}$$

As the excess current results in an increase of the current consumption (compared to the nominal constant-current pulse case) in the loop filter 42, the maximum allowed excess current $I_{emax}$ is another design boundary, and may be used to constrain the designed-for value of $I_e$.

With the above in mind, one may summarize the bounding constraints defining the desired current pulse shape for the conversion feedback signal as, $$Q_{tot} = \int_0^{T_P} i_{fb}(t)\,dt = T_P \cdot I_0, \quad \text{Eq. (4)}$$

$$i_{fb}(T_P)I_r < I_{rmax}, \text{ and} \quad \text{Eq. (5)}$$

$$\max[i_{fb}(t)] - I_0 = I_P - I_0 < I_{emax} \quad \text{Eq. (6)}$$

where $I_{emax}$, $I_{rmax}$, and $Q_{tot}$ are assumed to be known design parameters.

Figure 13:
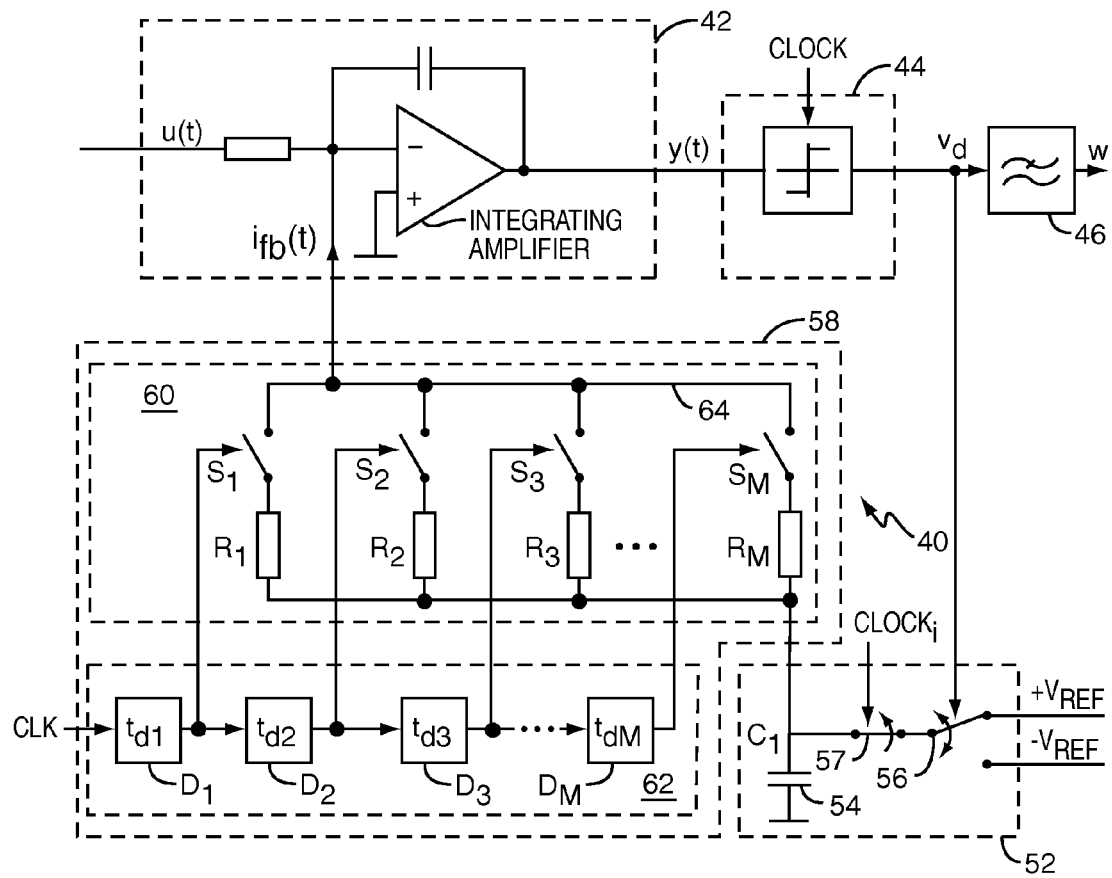
FIG. 13 is a block diagram of another embodiment of the DAC illustrated in FIG. 6, based on a parallel resistor network.

One approach to implementing the desired current pulse shaping for the DAC-generated conversion feedback signal appears in the ADC embodiment illustrated in FIG. 13, for example. In this embodiment, the resistive circuit 58 of the DAC 50 comprises a parallel resistor network $R_1$-$R_M$) coupled to the capacitor circuit 52 through a resistance control circuit (switches $S_1$-$S_M$, delay elements $D_1$-$D_{M-1}$) that, during each feedback cycle, is configured to increase over time the number of parallel resistors coupling the capacitor circuit 52 to an output node 64 of the resistive circuit 58.

More particularly, in this embodiment, the variable resistance device 60 comprises resistors $R_1$-$R_M$, and the resistance control circuit 62 comprises switches $S_1$-$S_M$ individually coupling respective ones of the resistors $R_1$-$R_M$ to the capacitor circuit 52, and a switching delay circuit (successive delay elements $D_1$-$D_{M-1}$) that generate successively delayed switch activation signals during each feedback cycle. With this embodiment, the assertion of each switch activation signal increases the number of parallel resistors coupling the capacitor circuit 52 to the output node 64 of the resistive circuit 58, thereby progressively reducing the series resistance of the resistive circuit 58 over each feedback cycle of the ADC 40.

With the above configuration, the DAC 50 essentially comprises a switched capacitor 54 and M switched resistors that have individual control signals so that they switch at different time instants during each feedback cycle of the ADC 40. For each such feedback cycle, the capacitor 54 initially stores a well-defined charge $Q = C_{REF} \cdot \pm V_{REF}$. When the first resistor, $R_1$, is switched, a current $I_1 = \pm V_{REF}/R_1$ starts to flow into a virtual ground of the loop filter 42. Further, the magnitude of the voltage on the capacitor, $V_C$, starts to decrease, which in turn causes the magnitude of the current to begin decreasing. The discharge speed at the first switching instant is limited by the time constant determined by the resistance of the resistive circuit 58 and the capacitance of the capacitor circuit 52. In other words, the time constant $\tau_1 = C_{REF} \cdot R_1$.

At a second, later switching instant, $R_2$ also starts to conduct current and the total current of the conversion feedback signal at the second switching instant is therefore $i_{fb}(t_2) = V_C(t_2)/(R_1 \cdot R_2/(R_1 + R_2))$. Because the parallel connection of $R_1$ and $R_2$ has a lower resistance than $R_1$ by itself, the magnitude of $i_{fb}(t)$ increases when $R_2$ is switched into parallel with $R_1$. By choosing the resistance values of the parallel resistors $(R_1$-$R_M)$ properly, it is possible to keep the current $i_{fb}(t)$ of the conversion feedback signal approximately constant until the final resistor $R_M$ has been switched into parallel connection by switch $S_M$. Thereafter the remaining charge on the capacitor 54 is discharged through the equivalent resistance of all the parallel resistors, which generally will be much lower than the smallest individual resistor taken by itself. That characteristic allows rapid falloff of $i_{fb}(t)$ to at or below the desired residual current level at the end of the feedback cycle.

Of course, it should be understood that the architecture shown in FIG. 13 provides an example for discussion, but is not limiting with respect to the teachings herein. For example, FIG. 13 illustrates a single-ended configuration for simplification, wherein CLOCKi driving the pre-charging switch 56 represents an inverted version of the illustrated CLOCK signal. In principle, the switch 56 is used to select the sign of the reference voltage, whereas the switch 57 is used to disconnect the reference from the capacitor 54 during the discharge phase of the DAC 50, and to connect it to the reference during the capacitor charging phase. That is, the switch 57 and the switches $s_1$-$s_M$ of the variable resistance device 60 are ON in different phases. Thus, the illustration should be understood as a simplified presentation, not necessarily representing the best way to arrange the circuit elements for optimal performance.

Figure 14:
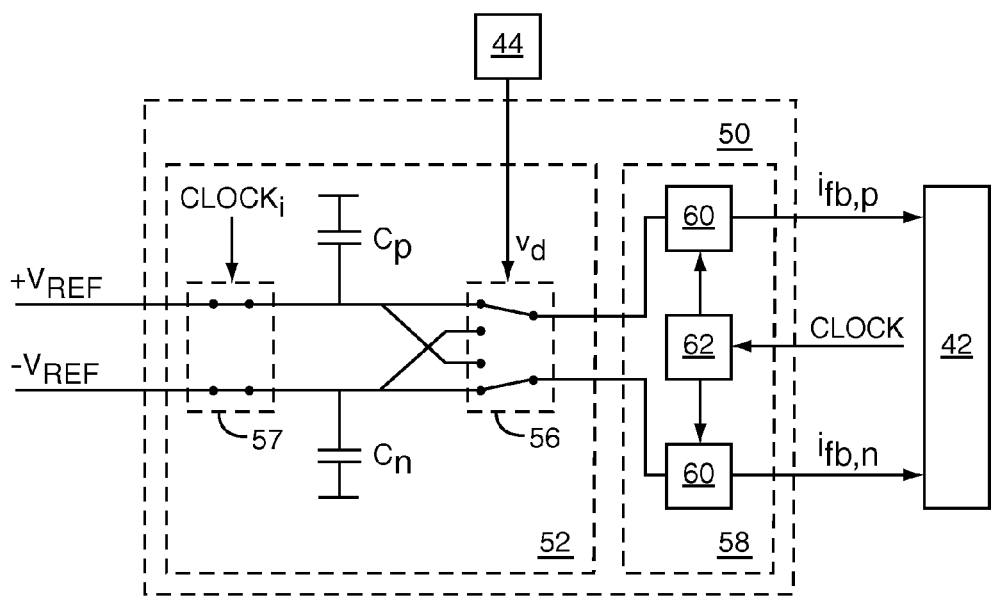
FIG. 14 is a block diagram of a differential embodiment of the DAC illustrated in FIG. 6.

FIG. 14 illustrates an alternative circuit element based on a differential implementation of the DAC 50. With the differential implementation, the sign of the conversion feedback signal is selected in the discharge phase of the capacitor 54, rather than during its pre-charge phase. Because the DAC 50 is differential, multiplication by −1 can be done simply by cross-coupling the signal connections as illustrated in the switch 56 in the diagram. Alternatively, the cross coupling for sign control may be implemented in the resistive circuit 58, before or after the variable resistance device 60. (Note that with differential embodiments of the DAC 50, the corresponding integrating amplifier(s) within the loop filter 42 are configured as differential integrating amplifiers.

Figure 15:
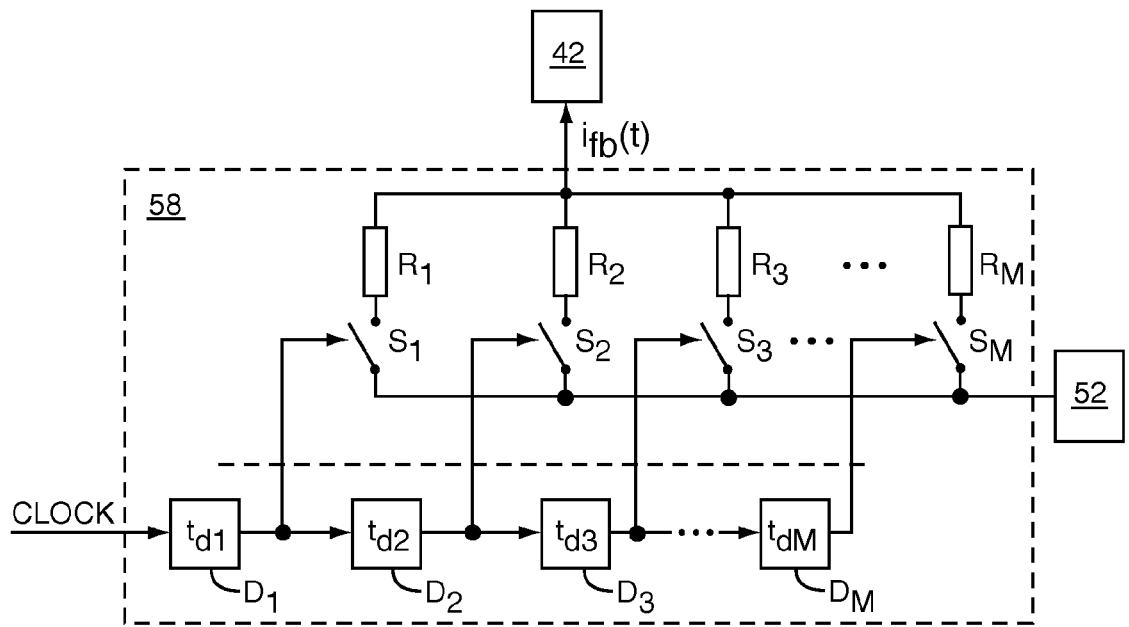
FIG. 15 is a block diagram of another embodiment of the DAC illustrated in FIG. 6, based on another parallel resistor network.
Figure 16:
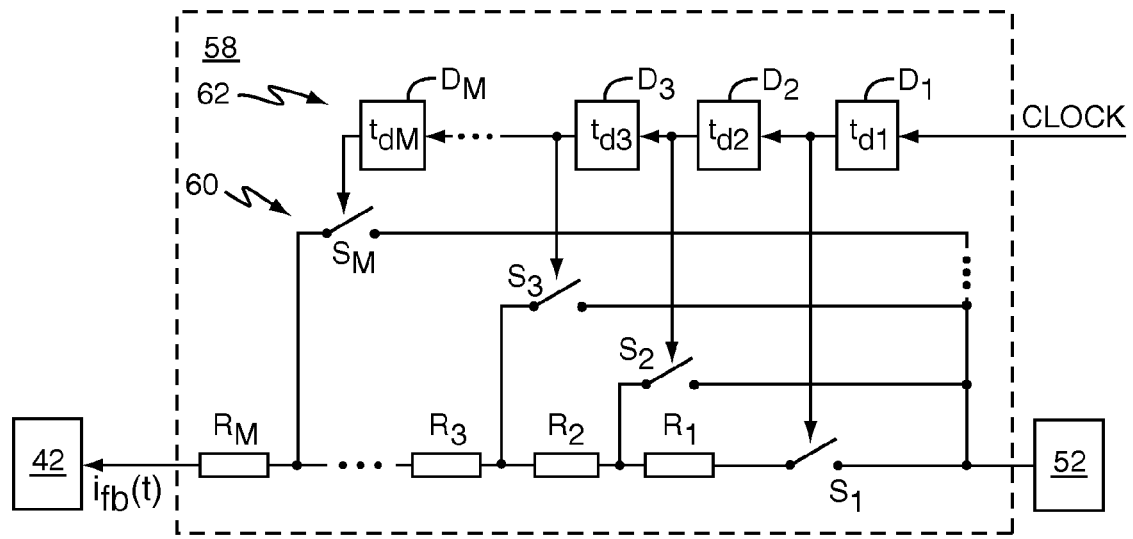
FIG. 16 is a block diagram of another embodiment of the DAC illustrated in FIG. 6, based on a series resistor network.

In addition to single-ended versus differential embodiments, it should be understood that the parallel resistor network illustrated in FIG. 13 is one example of a resistor network whose effective series resistance can be controlled. Numerous other circuit arrangements may be implemented to change the effective series resistance of the resistive circuit 58 over time, e.g., at discrete time instants over the feedback cycle. It is contemplated herein to implement the required variable resistance using any number of resistors and switches, combinations of parallel and serial resistors, or essentially any other resistor/switch network that provides the desired resistance control range. For example, FIG. 15 illustrates yet another switch/resistor configuration for a parallel resistor network embodiment of the resistive circuit 58. Further, FIG. 16 illustrates yet another alternative resistor/switch circuit arrangement for the resistive circuit 58, where it comprises a series resistor network. Moreover, it is contemplated herein that continuously variable resistance elements, e.g., bias-controlled transistors, may be used, whether adjusted in continuous fashion or in discrete steps.

In general, in a parallel resistor network embodiment of the resistive circuit 58, the number of parallel resistors connecting the capacitor circuit 52 to the integrator 42 can be increased during the feedback cycle to correspondingly decrease the effective series resistance of the conversion feedback path that couples the capacitor circuit 52 to the integrator 42. Equivalently, in a series resistor network embodiment of the resistive circuit 58, the number of series resistors connecting the capacitor circuit 52 to the integrator 42 can be decreased during the feedback cycle—such as by closing resistor bypass switches—to correspondingly decrease the series resistance of the conversion feedback path. In both the parallel and series embodiments, time-spaced switch activation signals may be used to increase over time the number of parallel resistors connecting the capacitor circuit 52 to the integrator 42, or to decrease over time the number of series resistors connecting the capacitor circuit 52 to the integrator 42.

Thus, in a general embodiment, varying the (effective) series resistance associated with the capacitor circuit 52 during each feedback cycle according to a desired current pulse shape for the conversion feedback signal comprises adjusting a variable resistance element either continuously or discretely over the feedback cycle. In another general embodiment, varying a series resistance associated with the capacitor circuit 52 during each feedback cycle according to a desired current pulse shape for the conversion feedback signal comprises changing a configuration of a switched resistor network over the feedback cycle.

Figure 17:
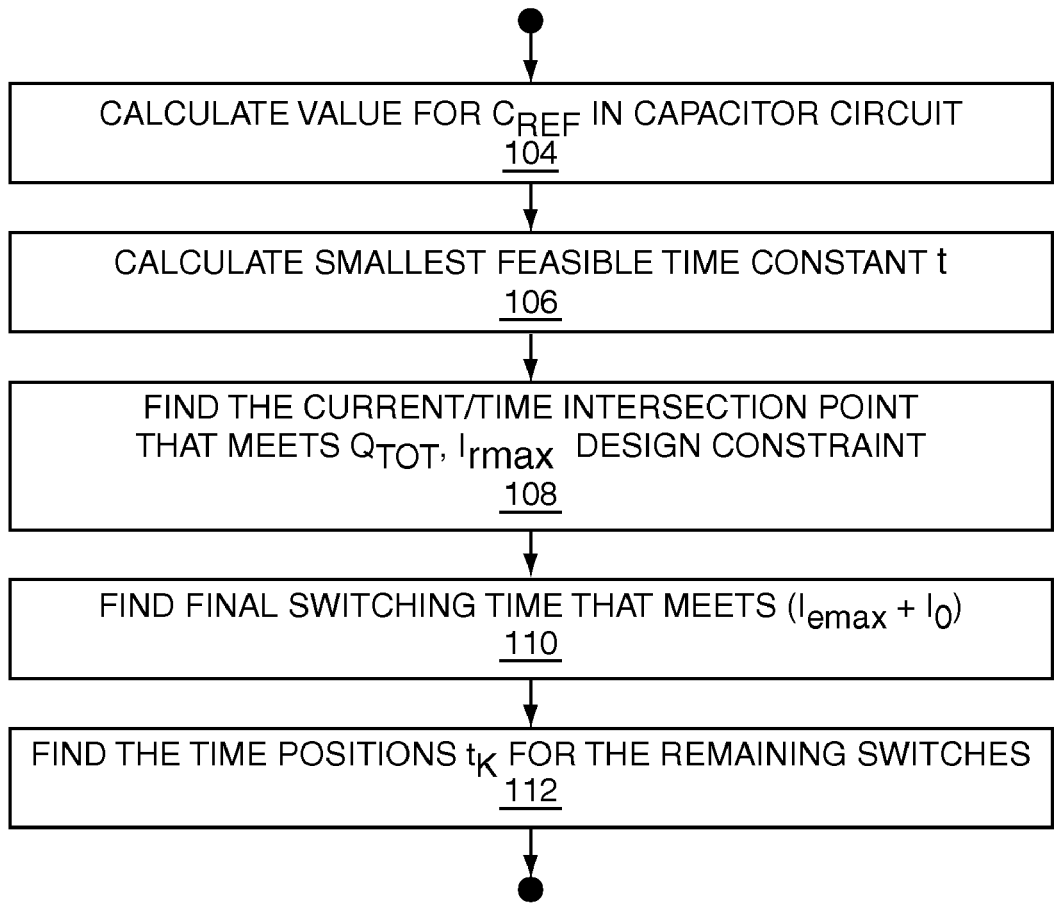
FIG. 17 is a logic flow diagram of one embodiment of processing logic to determine the bounding constraints illustrated in FIG. 12, and correspondingly operating the DAC of FIG. 13, for example.

FIG. 17 illustrates a more general method of using the above switched-resistor embodiment of the DAC 50 for generating the conversion feedback signal according to the current pulse bounding constraints illustrated in FIG. 12. The general design methodology exemplified by the illustrated method relates to a total (transferred) charge design boundary that is exact for first-order sigma-delta ADCs and approximate but still quite useful for higher-order sigma-delta ADCs. In general, the charge boundary methodology is applicable to current pulse shapes that approximate square wave pulses. (For higher-order systems, the impulse response from the DAC input $v_d$, to the loop filter output y should be made in such a way that it is identical to the impulse response of the equivalent SI pulse at the comparison instants of the ADC's quantizer. This condition can be satisfied by super-positioning the impulse response of each feedback path through the loop filter, where the number of feedback paths is equal to the loop filter order.)

Figure 18:
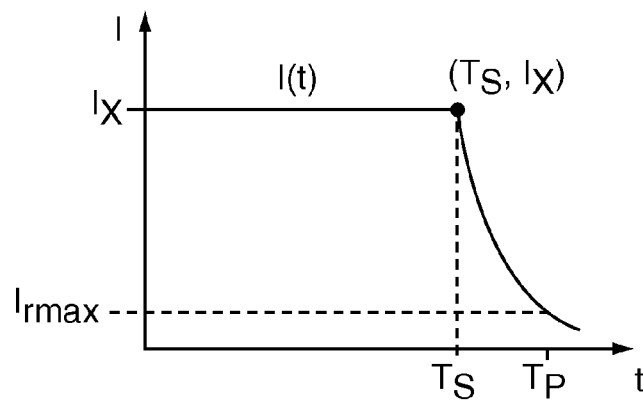
FIGS. 18 and 19 illustrate the current and time parameters associated with the method illustrated in FIG. 17.
Figure 19:
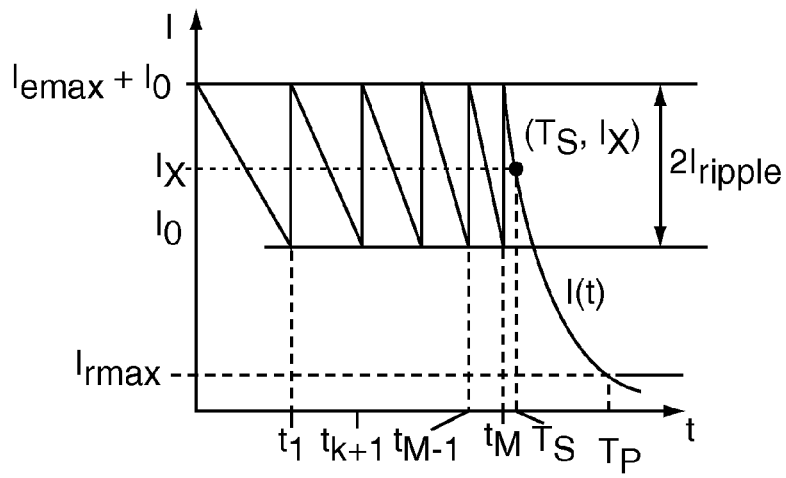

The illustrated method begins with calculating a value for the capacitor 54 ($C_{REF}$) in the capacitor circuit 52 (Step 104). The lower limit for $C_{REF}$ is defined by the kT/C switching noise. The method continues with calculating the smallest feasible time constant τ (Step 106). Note that the smallest time constant is a product of $C_{REF}$ and the smallest series resistance that discharges $C_{REF}$. The individual switch resistance of switches $S_1$-$S_M$, which may be transistors, MEMs, etc., and the input impedance of the loop filter 42 define the lower limit of this value. Next, with reference to the current and amplitude waveform graphs of FIGS. 18 and 19 for the conversion feedback signal, which graphically illustrate the time and current parameters involved in the design methodology of FIG. 17, the point ($T_s$, $I_x$) is determined as the point that fulfills the first two of the design boundaries ($Q_{tot}$ and $I_{rmax}$). This determination assumes constant current $I_x$ from t=0 to t=$T_s$, and an exponential decay with time constant τ from t=$T_s$ to t=$T_p$ (Step 108). More formally, the methodology may solve the following nonlinear equations:

$$Q_{tot} = I_x \cdot T_S + I_x \int_{T_S}^{T_P} e^{-(t-T_S)/\tau} dt, \text{ and} \quad \text{Eq. (7)}$$

$$I_x \cdot e^{-(T_P-T_S)/\tau} = I_{rmax} \quad \text{Eq. (8)}$$

The method continues with finding the time position $t_M$ of the last switch that fulfills the last design boundary ($I_{emax}+I_0$) (Step 110). The starting point is ($T_s$, $I_x$) from where the exponential decay is extended backward in time until it reaches the maximum allowed current $I_{emax}+I_0$. Here one may define the ripple level as $I_{ripple}=I_{emax}+I_0-I_x$. Next, the switching time instants $t_k$ of the remaining switches that fulfill the last design boundary ($I_{emax}+I_0$) are determined (Step 112). The starting point is ($t_k+1$, $I_x-I_{ripple}$) from where the exponential decay with time constant $\tau_k$ is extended backward in time until it reaches the maximum allowed current $I_{ripple}+I_x$. In other words, one may assume a ripple that symmetrically extends $2I_{ripple}$ around $I_x$ such that average current will be approximately equal to $I_x$.

The time constant $\tau_k$ used for the exponential decay generally is not arbitrary, but rather is uniquely defined by the voltage across the capacitor $C_{REF}$ and the current $I_x-I_{emax}$ at t=$t_{k+1}$. That is, $\tau_k=R_k C_{REF}$, where $R_k=V_C(t_{k+1})/(I_x-I_{emax})$. Note that this last method step is repeated until time zero (t=0) is reached or crossed.

Figure 20:
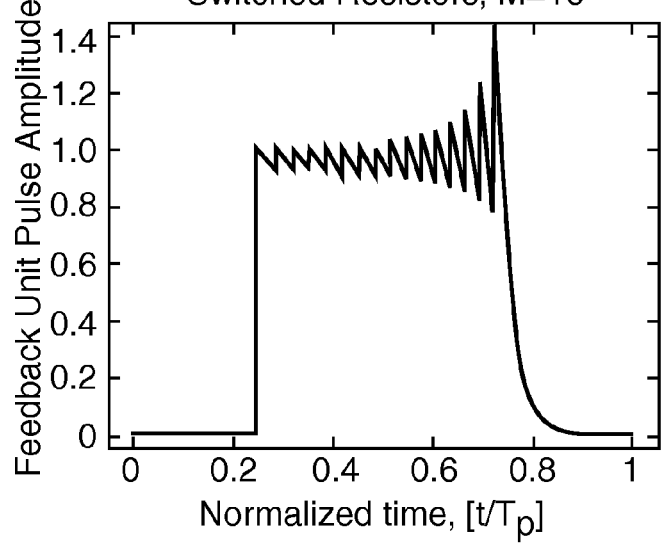
FIG. 20 is a graph of conversion feedback signal amplitude for the DAC of FIG. 13, for example, according to a given number of switched resistors in a parallel resistor network and uniform switch activation delays.
Figure 21:
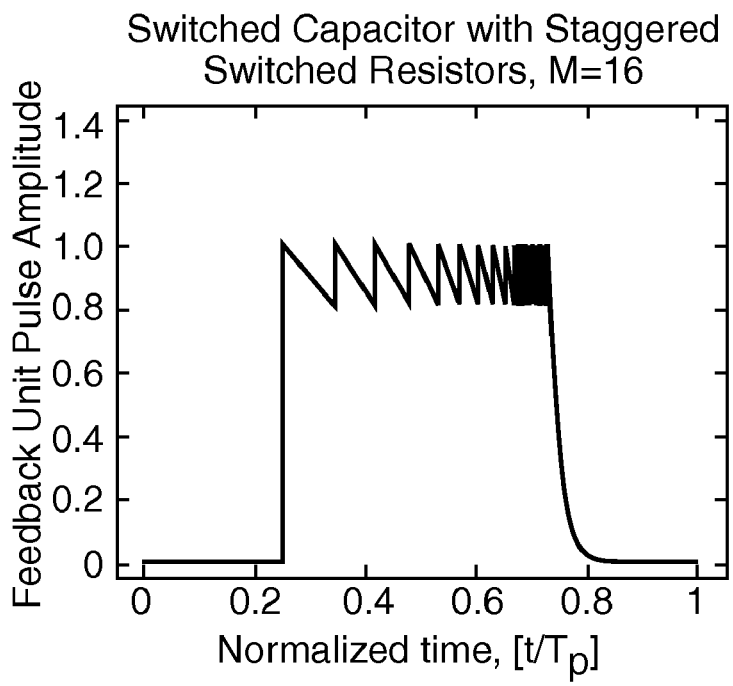
FIGS. 21 and 22 are graphs of conversion feedback signal amplitude for the DAC of FIG. 13, for example, according to given numbers of switched resistors in a parallel resistor network and non-uniform switch activation delays.
Figure 22:
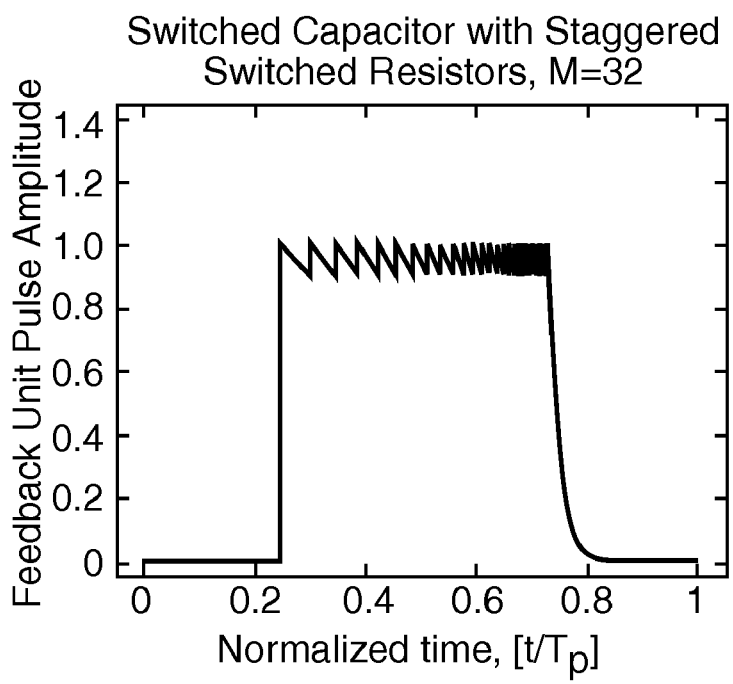

FIGS. 20-22 illustrate switching ripple associated with operation of the switches $S_1$, $S_2$, and so on, in the resistance control circuit 62 illustrated in FIG. 13, for example. The switching delay circuit of the resistance control circuit 62, which includes the switches $S_1$-$S_M$ and the delay line comprising delay elements $D_1$-$D_{M-1}$, may be configured, for example, to have uniformly spaced switching delays. With uniformly spaced switching delays, the number of resistors connected in parallel increases over the feedback cycle according to uniformly spaced switching times. FIG. 20 illustrates uniformly spaced switching in this manner for an embodiment where M=16, i.e., 16 switched resistors in the parallel resistor network comprising the variable resistance device 60.

In contrast, FIG. 21 illustrates the same number of switched resistors, but depicts the use of non-uniform switching delays over the feedback cycle. For example, individual ones of the delay elements $D_1$-$D_{M-1}$ can be configured to have different delay values, such that assertions of the switching delay signals have non-uniform time spacings. Whether by that particular approach or not, the DAC 50 may be configured to have non-uniformly spaced switching delays and, more particularly, may be configured such that the switching delays of the switching delay circuit are more closely spaced apart in time during an ending portion of each feedback cycle, as compared to a beginning portion of each feedback cycle.

As FIG. 21 illustrates, more closely spacing switching delays over time during a given feedback cycle reduces amplitude ripple in the conversion feedback signal, which yields a number of benefits. Indeed, both FIG. 20 and FIG. 21 depict the same number of switched resistors in the parallel resistor network, such that the ripple reduction evidenced in FIG. 21 is entirely attributable to the use of non-uniformly spaced switching delays. Further improving the ripple reduction gained by the use of non-uniformly spaced switching delays, FIG. 22 illustrates ripple reduction improvements and discharge time improvements over FIG. 21 through the use of a more switching resistors in the parallel resistor network, e.g., M=32.

Of course, as noted in the discussion of FIG. 8 and elsewhere herein, the DAC 50 may use continuously variable or discretely variable series resistance to effect the desired current pulse shaping for the conversion feedback signal. For example, the series resistance provided by the DAC 50 may progress from a high resistance to a low resistance during each feedback cycle based on changing the bias signal of a pass transistor device over the feedback cycle, or changing the number of resistors actively connected in a parallel resistor network over the feedback cycle. That is, the resistance control circuit 62 may be configured to change the number of parallel resistors comprising the variable resistance device 60 that couple the capacitor circuit 52 to the loop filter 42 during each feedback cycle, according to the desired current pulse shape of the conversion feedback signal. As noted, that operation may be accomplished by generating successively delayed switch activation signals during each feedback cycle, wherein each switch activation signal increases the number of parallel resistors coupling the capacitor circuit 52 to the loop filter 42.

Figure 23:
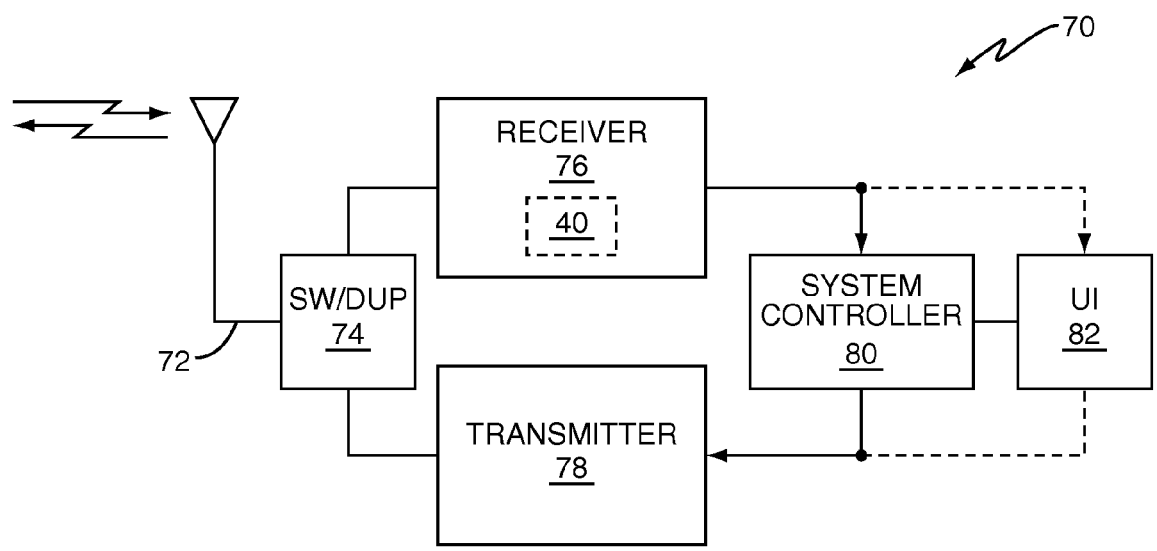
FIG. 23 is a block diagram of an example wireless communications device or system, including an embodiment of the ADC illustrated in FIG. 6.

In any of the above configurations, the ADC 40, including the DAC 50, may be readily incorporated into integrated circuit devices useful in a variety of applications. By way of non-limiting example, FIG. 23 illustrates one such application, wherein a wireless communication device or system 70 includes an embodiment of the ADC 40. More particularly, the wireless communication device 70, which may be a mobile station for use in a wireless communication network, for example, includes an antenna 72, a switch and/or duplexer 74, a receiver 76, a transmitter 78, a system controller 80, and a user interface 82. (The user interface 82 may include a display, keypad, audio input/output circuits, etc., depending on the intended use of the wireless communication device 70.)

By incorporating an embodiment of the ADC 40 within the receiver 76, receiver operations, such as baseband signal processing involving analog-to-digital conversion, may benefit from the reduced clock jitter and reduced maximum currents inuring from use of the DAC 50 as described herein. Of course, other or additional ADCs 40 may be implemented elsewhere within the wireless communication device 70, such as in user interface 82, wherein audio or other analog input signals may be digitized for processing.

Further, while one or more illustrative examples given herein involve first-order sigma-delta ADCs, the teachings herein directly apply to higher-order devices. It should be also understood that the teachings herein directly apply to multi-bit quantizers and DACs. Moreover, those skilled in the art will appreciate that any "single-ended signal" illustrations used in this discussion stand as non-limiting examples, and that the teachings herein directly apply to differential signal circuit implementations.

Additionally, in one or more embodiments, conversion feedback signal pulse shaping as taught herein may be used to generate feedback signals for only a subset of integrating amplifiers within a sigma-delta ADC loop filter having two or more integrating amplifiers. For example, the inventive current pulse shaping method to conversion feedback signal may be used for an outermost conversion feedback path to a first integrating amplifier in the ADC loop filter, whereas traditional switched-current source techniques may be used to generate conversion feedback signals for one or more inner conversion feedback paths going to additional integrating amplifiers.

As such, the present invention is not limited by the foregoing description and accompanying drawings. Instead, the present invention is limited only by the claims and their legal equivalents.

What is claimed is:

1. A digital-to-analog converter (DAC) for generating a conversion feedback signal in a sigma-delta type analog-to-digital converter (ADC), the DAC functioning as a current pulse generator and comprising:
    a capacitor circuit configured to be pre-charged to a reference voltage for each feedback cycle of the ADC; and
    a resistive circuit for transferring charge between the capacitor circuit and a loop filter of the ADC in each feedback cycle;
    said resistive circuit configured to vary its resistance during each feedback cycle in accordance with a desired current pulse shape for the conversion feedback signal.

2. The DAC of claim 1, wherein the desired current pulse shape is defined by a desired amount of charge to be transferred in each feedback cycle and desired maximum and residual current values for the conversion feedback signal in each feedback cycle.

3. The DAC of claim 1, wherein the resistive circuit is configured to exhibit a maximum resistance at a beginning of a feedback cycle and to reduce its resistance during the feedback cycle, and thereby exhibit a minimum resistance at an end of the feedback cycle.

4. The DAC of claim 3, wherein the resistive circuit includes one of a pass transistor device whose bias signal is changed over the feedback cycle, or a parallel or series resistor network whose number of resistors actively connected in parallel or in series is changed over the feedback cycle.

5. The DAC of claim 1, wherein the resistive circuit comprises a continuously variable resistance device and a resistance control circuit, and wherein the resistance control circuit is configured to vary the resistance of the continuously variable resistance device during each feedback cycle.

6. The DAC of claim 5, wherein the continuously variable resistance device comprises a pass transistor, and wherein the resistance control circuit comprises a dynamic bias control circuit that is configured to adjust one or more pass transistor bias signals during each feedback cycle according to the desired current pulse shape of the conversion feedback signal.

7. The DAC of claim 5, wherein the resistance control circuit is configured to control the resistance of the continuously variable resistance device during each feedback cycle by decreasing the resistance of the resistive circuit as the capacitor circuit discharges during each feedback cycle.

8. The DAC of claim 1, wherein the resistive circuit comprises a parallel or series resistor network coupled to the capacitor circuit through a resistance control circuit that, during each feedback cycle, is configured to increase over time the number of parallel resistors coupling the capacitor circuit to an output node of the resistive circuit, or to decrease over time the number of series resistors coupling the capacitor circuit to the output node of the resistive circuit.

9. The DAC of claim 8, wherein the resistance control circuit comprises a switching delay circuit that generates successively delayed switch activation signals during each feedback cycle, wherein each switch activation signal increases the number of parallel resistors coupling the capacitor circuit to the output node of the resistive circuit, or decreases the number of series resistors coupling the capacitor circuit to the output node of the resistive circuit.

10. The DAC of claim 9, wherein the switching delay circuit is configured to have uniformly spaced switching delays.

11. The DAC of claim 9, wherein the switching delay circuit is configured to have non-uniformly spaced switching delays, and wherein the switching delays of the switching delay circuit are more closely spaced apart in time during an ending portion of each feedback cycle, as compared to a beginning portion of each feedback cycle.

12. A sigma-delta type ADC including an outer conversion feedback path driven by the DAC of claim 1, and an inner conversion feedback path driven by a switched current source DAC.

13. A wireless communication receiver including a sigma-delta ADC for received signal digitization, said sigma-delta ADC having the DAC of claim 1.

14. A method of generating a conversion feedback signal in a sigma-delta type analog-to-digital converter (ADC), the method comprising:
    generating the conversion feedback signal in each feedback cycle of the ADC as a current pulse from a capacitor circuit; and varying a series resistance associated with the capacitor circuit during each feedback cycle according to a desired current pulse shape for the conversion feedback signal.

15. The method of claim 14, further comprising defining the desired current pulse shape based on a desired amount of charge to be transferred in each feedback cycle and desired maximum and residual current values for the conversion feedback signal in each feedback cycle.

16. The method of claim 15, further comprising determining the desired maximum current value in accordance with a gain-bandwidth limit of the loop filter.

17. The method of claim 15, further comprising determining the desired residual current value in accordance with a desired level of clock jitter insensitivity.

18. The method of claim 14, wherein varying a series resistance associated with the capacitor circuit during each feedback cycle according to a desired current pulse shape for the conversion feedback signal comprises progressing from a high resistance to a low resistance during each feedback cycle.

19. The method of claim 18, wherein progressing from a high resistance to a low resistance during each feedback cycle comprises one of changing the bias signal of a pass transistor device over the feedback cycle, or changing the number of resistors actively connected in a parallel or series resistor network over the feedback cycle.

20. The method of claim 14, wherein varying a series resistance associated with the capacitor circuit during each feedback cycle according to a desired current pulse shape for the conversion feedback signal comprises, during each feedback cycle, controlling a variable resistance device via a resistance control circuit.

21. The method of claim 20, wherein the variable resistance device comprises a pass transistor, and wherein controlling a variable resistance device via a resistance control circuit comprises controlling a bias signal of the pass transistor via the resistance control circuit.

22. The method of claim 20, wherein the variable resistance device comprises a parallel or series resistor network, and wherein controlling a variable resistance device via a resistance control circuit comprises controlling the number of resistors connected in parallel or in series within the parallel or series resistor network via the resistance control circuit.

23. The method of claim 14, wherein varying a series resistance associated with the capacitor circuit during each feedback cycle according to a desired current pulse shape for the conversion feedback signal comprises changing the number of parallel or series resistors coupling the capacitor circuit to a loop filter of the ADC during each feedback cycle.

24. The method of claim 23, wherein changing the number of parallel or series resistors coupling the capacitor circuit to a loop filter of the ADC during each feedback cycle comprises, within any given feedback cycle, increasing over time the number of parallel resistors coupling the capacitor circuit to the loop filter, or decreasing over time the number of series resistors coupling the capacitor circuit to the loop filter.

25. The method of claim 23, wherein changing the number of parallel or series resistors coupling the capacitor circuit to a loop filter of the ADC during each feedback cycle comprises generating successively delayed switch activation signals during each feedback cycle, wherein each switch activation signal increases the number of parallel resistors coupling the capacitor circuit to the loop filter, or decreases the number of series resistors coupling the capacitor circuit to the loop filter.

26. The method of claim 25, comprising generating the switching delay signals according to a uniform time spacing.

27. The method of claim 25, comprising generating the switching delay signals according to a non-uniform time spacing.

28. The method of claim 14, wherein varying a series resistance associated with the capacitor circuit during each feedback cycle according to a desired current pulse shape for the conversion feedback signal comprises adjusting a variable resistance element either continuously or discretely over the feedback cycle.

29. The method of claim 14, wherein varying a series resistance associated with the capacitor circuit during each feedback cycle according to a desired current pulse shape for the conversion feedback signal comprises changing a configuration of a switched resistor network over the feedback cycle.

* * * * *

UNITED STATES PATENT AND TRADEMARK OFFICE
CERTIFICATE OF CORRECTION

| | |
|---|---|
| PATENT NO. | : 7,414,557 B2 |
| APPLICATION NO. | : 11/611495 |
| DATED | : August 19, 2008 |
| INVENTOR(S) | : Andersson et al. |

It is certified that error appears in the above-identified patent and that said Letters Patent is hereby corrected as shown below:

On the Title Page, item (75), under "Inventors", in Column 1, Line 2, delete "Sundstrom," and insert -- Sundström, --, therefor.

In Column 2, Line 2, delete "$Q_{tot}$" and insert -- $Q_{tot}$, --, therefor.

Signed and Sealed this

Thirty-first Day of March, 2009

JOHN DOLL
*Acting Director of the United States Patent and Trademark Office*